(12) United States Patent
Peev et al.

(10) Patent No.: US 11,275,129 B2
(45) Date of Patent: Mar. 15, 2022

(54) SENSOR DEVICE

(71) Applicant: Melexis Bulgaria Ltd., Sofia (BG)

(72) Inventors: Rumen Marinov Peev, Sofia (BG); Tsvetan Miroslavov Marinov, Sofia (BG); Stoyan Georgiev Gaydov, Sofia (BG)

(73) Assignee: MELEXIS BULGARIA LTD., Sofia (BG)

( * ) Notice: Subject to any disclaimer, the term of this patent is extended or adjusted under 35 U.S.C. 154(b) by 31 days.

(21) Appl. No.: 16/744,319

(22) Filed: Jan. 16, 2020

(65) Prior Publication Data
US 2020/0241085 A1   Jul. 30, 2020

(30) Foreign Application Priority Data
Jan. 28, 2019   (EP) ..................................... 19153934

(51) Int. Cl.
*G01R 33/07*   (2006.01)
*G01R 33/09*   (2006.01)

(52) U.S. Cl.
CPC .............. *G01R 33/07* (2013.01); *G01R 33/09* (2013.01)

(58) Field of Classification Search
CPC .............................. G01R 33/07; G01R 33/09
See application file for complete search history.

(56) References Cited

U.S. PATENT DOCUMENTS

| 2003/0012040 | A1* | 1/2003 | Orita .............. H03K 19/018521 363/73 |
| 2013/0328687 | A1 | 12/2013 | Nguyen et al. |
| 2019/0305565 | A1* | 10/2019 | Tran ....................... H02H 3/202 |

FOREIGN PATENT DOCUMENTS

| EP | 1058093 A1 | 12/2000 |
| EP | 2789983 A1 | 10/2014 |
| EP | 2846608 A1 | 3/2015 |

OTHER PUBLICATIONS

European Search Report from EP Application No. 19153934, dated May 31, 2019.

\* cited by examiner

*Primary Examiner* — Clayton E. LaBalle
*Assistant Examiner* — Michael A Harrison
(74) *Attorney, Agent, or Firm* — Workman Nydegger

(57) ABSTRACT

A sensor device comprises a sensor arranged to sense and convert the physical quantity into an electrical quantity and to output an electrical signal representative of the electrical quantity. A voltage limiter receives an input signal related to a supply voltage providing power to the sensor device and to output a voltage signal. The voltage signal has a limited value if the input voltage exceeds a voltage saturation threshold value. A voltage-to-current converter converts the voltage signal output by the voltage limiter to a supply current of a first value, thereby forming a first supply current state. A switch switches between the first supply current state and at least a second supply current state wherein the supply current is substantially independent of the supply voltage. Current generation means provides the supply current of the predetermined second value to form the second supply current state.

15 Claims, 2 Drawing Sheets

SENSOR DEVICE

FIELD OF THE INVENTION

The present invention is generally related to the field of sensor devices and more in particular to the field of two-wire sensor devices.

BACKGROUND OF THE INVENTION

A two-wire sensor has—as the name indicates—only two wires to connect the power supply and to conduct the measuring signals, in some two-wire sensor devices one of the supply current values at the device output is proportional to the supply voltage, therefore the power dissipation rises quadratically with the supply voltage. This may easily lead to over-heating, worsening of the sensor device reliability (decreasing life time) and/or permanent damage.

This well-known problem has already been addressed in the past. Solutions have been proposed wherein, when the output current reaches a given maximum output current, a clamping function is engaged, and the output current of the current driver remains substantially constant at the maximum selected output current with increasing input voltage. An important drawback of this solution is that the output current needs to be measured/sensed, which leads to additional device complexity and/or chip area.

Hence, there is a need for a sensor device wherein that need to perform an output current measurement is avoided.

SUMMARY OF THE INVENTION

It is an object of embodiments of the present invention to provide for a sensor device wherein excessive power dissipation is avoided without any need for additional current measurements.

The above objective is accomplished by the solution according to the present invention.

In a first aspect the invention relates to a sensor device comprising
  a sensor arranged to sense a physical quantity, to convert said physical quantity into an electrical quantity and to output an electrical signal representative of said electrical quantity,
  a voltage limiter arranged to receive an input signal related to a supply voltage and to output a voltage signal, said voltage signal having a limited value if said input voltage exceeds a voltage saturation threshold value,
  a voltage-to-current converter arranged to convert said voltage signal output by said voltage limiter to a supply current of a first value, thereby forming a first supply current state,
  a switch arranged to switch between said first supply current state and at least a second supply current state wherein a supply current of a predetermined second value substantially independent of said supply voltage is provided, whereby the switching is controlled by said electrical signal.

The proposed solution indeed allows for keeping the power dissipation under control. As long as the sensor electrical signal remains below a certain switching threshold level, a current of a predetermined fixed value is applied. As soon as the electrical signal output from the sensor reaches or exceeds the switching threshold level, the electrical signal of the sensor causes a switch to change to a second supply current state, wherein a current is output in accordance with a voltage coming out of the voltage limiter to which the supply voltage or a voltage signal derived from the supply voltage is applied. If the applied voltage is below a voltage saturation threshold value, the voltage limiter outputs a voltage to the voltage-to-current converter which is proportional to the supply voltage. Above said voltage saturation threshold value the voltage limiter limits the applied voltage and outputs a limited voltage signal which is substantially independent of said supply voltage. Hereby, 'substantially independent' is to be construed as not having a particular relation to the supply voltage. In this way the current signal at the sensor device output is kept at an acceptable level in all circumstances.

In a preferred embodiment the sensor device comprises a current source arranged to provide the supply current of said predetermined second value to form the second supply current state.

In a preferred embodiment the switch is arranged to switch to the second supply current state when the electrical signal does not exceed the switching threshold value and to switch to the first supply current state when the electrical signal exceeds the switching threshold value.

Preferably the sensor device comprises a current amplifier arranged to be supplied with a current signal via the switch and to output an amplified current signal.

Advantageously the voltage saturation threshold value of the voltage limiter is programmable.

The voltage limiter normally has a substantially linear characteristic for input voltages below the voltage saturation threshold value.

In embodiments of the invention the supply current of the first value is a fixed value in case the input voltage has been limited by the voltage limiter.

In a preferred embodiment the first and/or the second value of the supply current are programmable.

Advantageously, the sensor device comprises a thermal protection.

In one embodiment the sensor device comprises more than one switch is and arranged to provide at least one additional supply current substantially independent of said supply voltage.

In certain embodiments the sensor device is a two-wire sensor device. In other embodiments the sensor device is a Hall sensor device.

In embodiments the sensor is a magnetic sensor, for example a magneto resistive sensor, or an inductive sensor.

Preferably the sensor device is implemented as an integrated circuit.

In another aspect the invention relates to a sensor device as previously described and a controller device.

In a preferred embodiment the controller device is arranged to send a control signal to the sensor device to adapt the first and/or the second value.

In embodiments the controller device is arranged to send said control signal on detection of a diagnostic fail.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
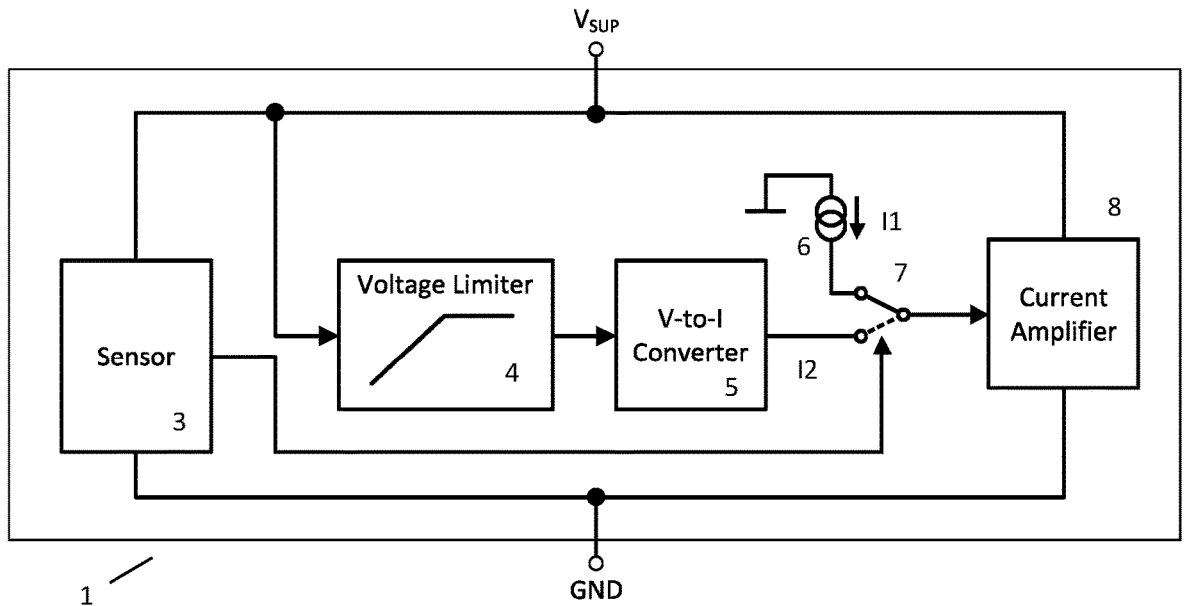
FIG. 1 illustrates a block scheme of an embodiment of the sensor device according to the present invention.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention is concerned with solving the problem of power dissipation, that occurs especially in two-wire sensor devices with a resistive output current versus supply voltage characteristic. A sensor device is proposed that is simple in its operation, requires little area and offers an effective solution to limit the supply power dissipation without the need to measure the supply current.

A sensor device according to one embodiment of the present invention is disclosed in FIG. 1. The sensor device (1) comprises a sensor (3). The sensor converts a physical quantity into an analog electrical quantity. The sensor in FIG. 1 can be a Hall sensor or another magnetic sensor, a pressure sensor or any other physical quantity sensor. Although the input signal containing the physical quantity to be converted in the sensor often represents a pressure, temperature or magnetic field, also other types of physical signals can be used as input to the sensor device of this invention.

Typically the electrical signal output by the sensor is too small to be used directly. Therefore, the signal comprising the electrical quantity received from the sensor is often amplified in a signal amplifier to obtain a more useful signal. The sensor device of the invention comprises in many embodiments such a signal amplifier. The signal amplifier can be chopped. In one embodiment the signal amplifier is a differential amplifier. It may be instrumentation amplifier.

The scheme of FIG. 1 is now further described. The sensor (3) is supplied with a voltage $V_{sup}$, possibly through a regulator (not shown). In the sensor device of the invention the supply current state is changed depending on the sensed physical quantity. Note that the supply current is the output current of the two-wire sensor device, optionally after amplification by a current amplifier.

As long as the electrical signal output by the sensor and corresponding to the sensed physical quantity (e.g. the sensed magnetic field) is found to be below a certain switching threshold (i.e. a reference level), the supply current is provided by a current source (6) that generates a current I1 of a predetermined value. This is one operational state of the sensor device. If, however, the electrical signal equivalent to the sensed physical quantity (e.g. the magnetic field) is above that switching threshold, the output current is provided via a path comprising a voltage limiter (4) and a voltage-to-current converter (5). This is the other operational state of the sensor device. The output current I2 is proportional to an input voltage equal to or derived from (e.g. a fraction of) $V_{sup}$ as long as the input voltage $V_{sup}$ does not exceed a voltage saturation threshold level. Once the supply voltage exceeds this voltage saturation threshold level the voltage limiter (4) outputs a fixed voltage instead of following the increasing supply voltage. The innovation proposed in the present invention is to provide said voltage limiter (4), which receives at its input the supply voltage pin. This allows avoiding excessive power dissipation in case the supply voltage increases beyond the voltage saturation threshold level. Indeed, the voltage limiter follows the input supply voltage until said voltage threshold level is reached, after which the voltage signal outputted by the voltage limiter does no longer follow the input and stays at a fixed voltage level. The output voltage signal is next applied to a V-to-I converter (5), which exhibits a "resistive behaviour": as long as the input of the V-to-I converter (i.e. the output signal of the voltage limiter) is not saturated, there is a linear relationship between voltage and current. For voltages beyond the saturation point (voltage threshold level) of the voltage limiter, the V-to-I converter does not display "resistive behaviour" anymore: as long as the input of the V-to-I converter (i.e. the output signal of the voltage limiter) is saturated, its output current I2 is also saturated.

The state of the switch (7) thus changes depending on the sensor state. The switch is controlled by the electrical signal from the sensor (3) and allows switching between the current signal I1 from the current source (6) and the current signal I2 output by the V-to-I converter (5). Note that although in FIG. 1 a current source is used, other options are available (e.g. a current amplifier, current multiplier, current buffer, current mirror, current divider, current splitter etc.) to generate a supply current of a certain value which is substantially independent of the supply voltage. Indeed, the key point is to produce a supply current that is substantially independent of (i.e. to a large degree, mostly not related to) the supply voltage. This supply current state is then used as long as the supply voltage remains at acceptable levels. Only when a certain threshold is exceeded one switches to another supply current state.

Figure 2:
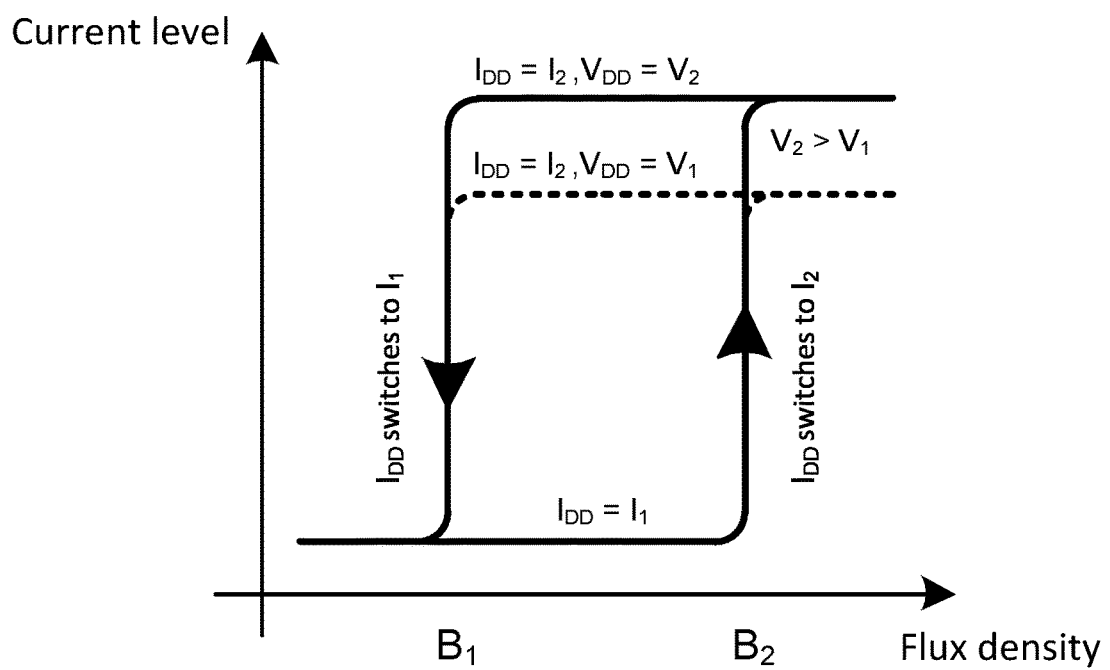
FIG. 2 illustrates the current output vs. magnetic field of an embodiment of the present invention implementing magnetic hysteresis.

In some embodiments the supply current comes from a current source (6) producing a current I1 of a predetermined value as long as the electrical signal corresponding to a sensed magnetic field remains below a threshold level. In other embodiments magnetic hysteresis may advantageously be exploited. FIG. 2 provides an illustration. Two magnetic switching thresholds B1 and B2 are implemented in FIG. 2, separated by a magnetic hysteresis instead of a single threshold. In this way toggling due to noise is avoided when the applied magnetic field is close to the switching threshold. B1 and B2 can be both positive, both negative or can have different signs. In other embodiments the relationship between the current level and the flux density can be different from that illustrated in FIG. 2, e.g. the supply current switches to I1 when the magnetic field is above the magnetic switching threshold B2 and the supply current switches to I2 when the magnetic field is below the magnetic switching threshold B1. As illustrated in the figure, the output current may depend on the supply voltage: two different I2 values correspond to different supply voltages V1 and V2.

In embodiments of the present invention the sensor device comprises one or more additional magnetic switching thresholds in order to implement a more complex switching function, e.g. magnetic switching function. Such more complex function could be for example an omnipolar switch function which comprises four magnetic switching thresholds. In embodiments of the present invention the sensor device comprises two or more sensors.

In some embodiments the switch can be a complex block comprising one or more additional switches and/or can be adapted to provide also a summing function. For example, the switch can be arranged to switch between the current signal I1 from the current source and the sum of the current signal I1 from the current source and the current signal I2 output by the V-to-I converter. Hence, the switch then provides I1 in one state and I1+I2 in the other state.

In embodiments of the proposed sensor device a current I0 consumed by internal blocks of the sensor device (intrinsic supply current consumption) can be used instead of (i.e. to substitute or to represent) the whole or part of the current signal from the current source. For example, assuming current amplification is available (with a factor k), the total supply current (being also the output current) provided by the sensor device is k*I1+I0 in one state and (k*I1+I0+k*I2) in the other state.

In some embodiments of the present invention the sensor device comprises one or more additional supply current sources and/or one or more additional V-to-I converters and the switch is adapted to allow switching between them. The switch can also be adapted to allow the usage of not only the input signals, but also the sum of the signals or of some of the signals during the switching process.

In preferred embodiments the sensor device comprises a current amplifier, which in one position of the switch receives its input from the current source (6) and/or in the other switch position the current signal output by the V-to-I converter (5). The current amplifier can be for example a current mirror. The current amplifier output is connected between the supply voltage pin Vsup and the ground pin GND.

In embodiments of the present invention the current amplifier is arranged to implement a different amplification factor depending on which signal is connected to its input. For example, assuming a current mirror is used as current amplifier, the current mirror ratio is switched together with the switch (7). As another example, assuming current amplification is available (with factors k1 for I1 and k2 for I1+I2), the total supply current (being also the output current) provided by the sensor device is k1*I1+I0 in one state and k2*(I1+I2)+I0 in the other state. In some embodiments of the invention the sensor device comprises one or more current amplifiers connected between the current source (6) and the switch (7) and/or the V-to-I converter (5) and the switch (7). For example, assuming current amplification is available (with factors k1 for I1 and k2 for I2), the total supply current (being also the output current) provided by the sensor device is k1*I1+TO in one state and (k1*I1+k2*I2+I0) in the other state.

In embodiments of the present invention the sensor device also comprises other appropriate analogue, digital or mixed signal processing means like for example signal shaping means, signal converting means, signal translating means, signal shifting means, etc.

Figure 3:
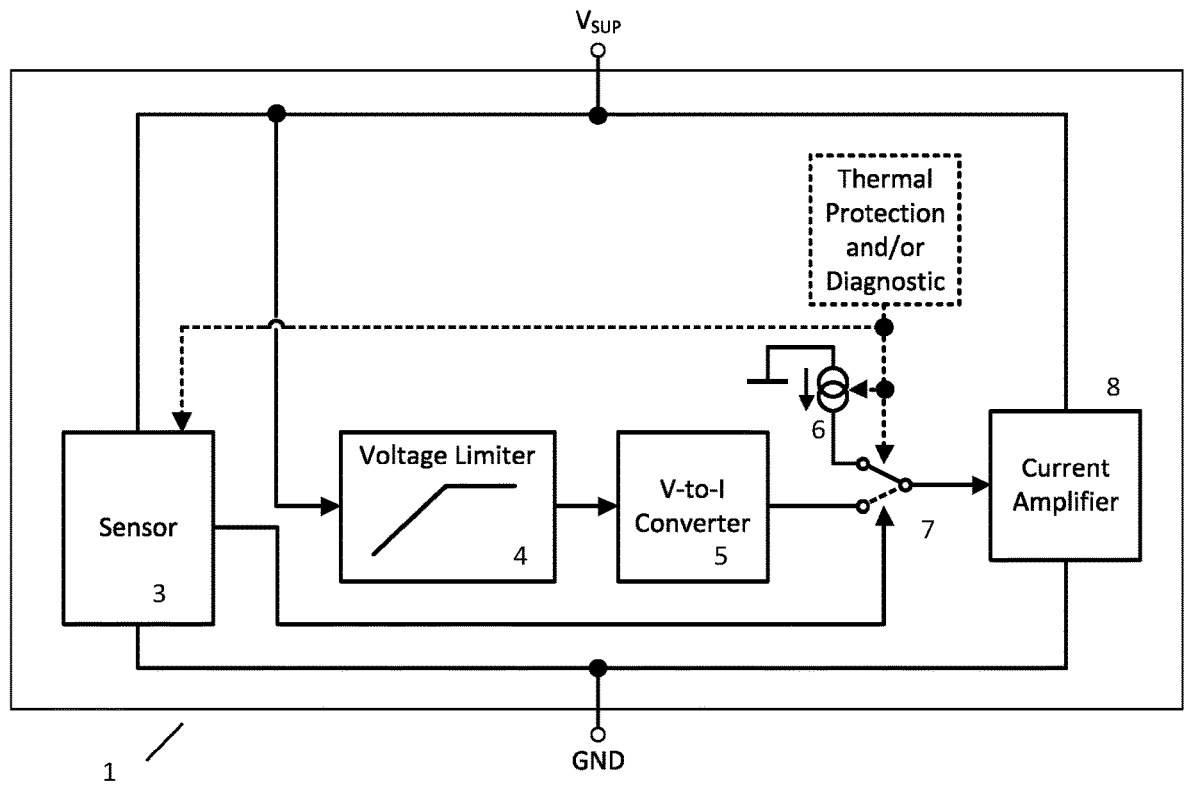
FIG. 3 illustrates an embodiment of the present invention comprising thermal protection and/or diagnostic.

In embodiments of the invention the sensor comprises thermal protection. FIG. 3 illustrates an embodiment comprising thermal protection. When this thermal protection indicates an increase of the junction temperature above a certain predefined threshold due to, for example, increased power dissipation, the signal output from the thermal protection, having priority over the signal output by the sensor (3), causes the switch to change to a state corresponding to the lowest current of all available currents. The thermal protection can additionally influence the current source (decreasing it or switching off the whole or a part of the current provided by the current source) and/or it can also cause the switch to change to a different current source with a lower value, wherein a lower supply current is output, e.g. substantially lower than the lowest normal supply current value. The thermal protection can also switch-off some internal sensor device blocks leading to a further decrease of the supply current. In embodiments of the invention the thermal protection can perform only one action, or any suitable combination of actions based on the received information.

In embodiments of the present invention the sensor device may comprise one or more diagnostic blocks (see FIG. 3). The purpose of such diagnostic block is, for example, to check if an internal signal (analogue or digital signal, voltage signal, current signal, timing signal, signal representing internal sensor state, etc.) is within the normal operating range. The diagnostic block can check whether an internal block is operating as expected. The sensor device can take appropriate actions in case of a diagnostic fail and/or send a signal to an external device, for example an Electronic Control Unit, in the system.

Figure 4:
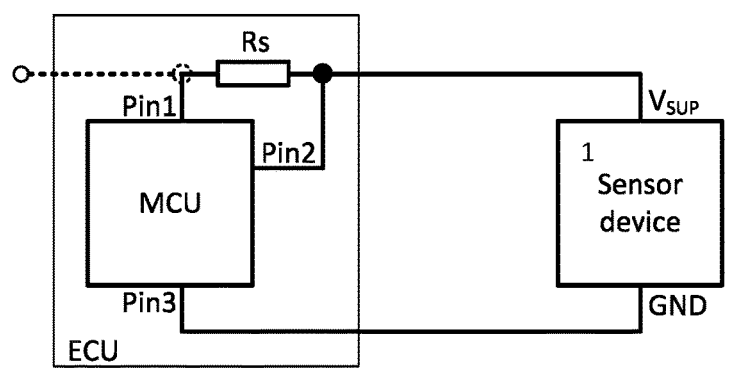
FIG. 4 illustrates a system comprising a sensor device and a controller device.

The invention also relates in one aspect to a system comprising a sensor device as previously described. The system further comprises a controller device (11). FIG. 4 provides an illustration. The controller device, for example implemented as an Electronic Control Unit (ECU) in a vehicle, measures the supply current through the sensor by measuring the voltage drop over the resistor Rs. The supply voltage Vsup may be provided from the ECU (Pin 1 of the microcontroller unit MCU) or from external voltage source (shown with dashed line on the figure) through the resistor Rs. The ECU may also control this external voltage source. In embodiments where the supply voltage Vsup is provided from an external voltage source the ECU is only measuring the voltage drop over the resistor Rs (Pin 1 and Pin 2).

In certain embodiments of the invention the controller device (11) can send a control signal to the sensor device to adapt the first and/or said second value, parameter or function of the sensor device or to change the operating mode of the sensor device. The control signal can be used to start/stop a diagnostic cycle in one embodiment. In certain embodiments the control signal can be sent to the sensor device via a separate wire. In other embodiments the control signal can be sent by sending different supply voltages to the sensor device which is then adapted to recognize these supply voltage changes.

The controller device (11) is in embodiments of the invention arranged for generating a control signal based on a diagnostic fail that has been observed. The controller device, for example implemented as an Electronic Control Unit (ECU) in a vehicle, measures the supply current through the sensor by measuring the voltage drop over the resistor (Rs). The first supply current state has a value in a predefined range. The upper and the lower range limits can be supply voltage dependent. The second supply current state has a value in a predefined range. The upper and the lower range limits can in certain cases be supply voltage independent. In this way the supply current signal generated by the sensor device is during normal operation within predefined range or ranges. When the generated supply current is observed to be outside of any of the normal operation range limits, for example substantially lower than the lowest normal supply current limit, there is a diagnostic fail.

In some embodiments the diagnostic fail detected by the one or more diagnostic blocks of the sensor device can be treated in the same or a similar way as the thermal protection signal is treated. For example, the output of the thermal protection leads to the same or similar effect as the diagnostic block output, i.e. causing a supply current decrease, so that the supply current is outside of any of the normal operation range limits, for example substantially lower than the lowest normal supply current limit.

In embodiments of the present invention safety measures can be implemented in the sensor device. The sensor device may comprise one or more diagnostic blocks providing the needed diagnostic coverage in order to fulfil functional safety requirements. The sensor device can be arranged to send information related to functional safety related diagnostic fail to the controller device and the controller device may be adapted to receive said information and take appropriate actions.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A sensor device comprising:
   a sensor arranged to sense a physical quantity, to convert said physical quantity into an electrical quantity and to output an electrical signal representative of said electrical quantity,
   a voltage limiter arranged to receive an input signal related to a supply voltage providing power to the sensor device and to output a voltage signal, said voltage signal having a limited value if said input voltage exceeds a voltage saturation threshold value,
   a voltage-to-current converter arranged to convert said voltage signal output by said voltage limiter to a supply current of a first value, thereby forming a first supply current state,
   a switch arranged to switch between said first supply current state and at least a second supply current state wherein a supply current of a predetermined second value independent of said supply voltage is provided, whereby the switching is controlled by said electrical signal, and current generation means arranged to provide said supply current of said predetermined second value to form said second supply current state.

2. The sensor device as in claim 1, comprising a current source arranged to provide said supply current of said predetermined second value to form said second supply current state.

3. The sensor device as in claim 1, wherein said switch is arranged to switch to said second supply current state when said electrical signal does not exceed a switching threshold value and to switch to said first supply current state when said electrical signal exceeds said switching threshold value.

4. The sensor device as in claim 1, wherein said switch is arranged to add in said first supply current state said supply current of said second value to said supply current of said first value.

5. The sensor device as in claim 1, comprising a current amplifier arranged to be supplied with a current signal via said switch and to output an amplified current signal.

6. The sensor device as in claim 1, wherein said voltage saturation threshold value of said voltage limiter is programmable and/or wherein said first and/or said second value of said supply current are programmable.

7. The sensor device as in claim 1, wherein said voltage limiter has a linear characteristic for input voltages below said voltage saturation threshold value.

8. The sensor device as in claim 1, wherein said supply current of said first value is a fixed value in case said voltage signal has been limited by said voltage limiter.

9. The sensor device as in claim 1, comprising a thermal protection.

10. The sensor device as in claim 1, comprising more than one switch and arranged to provide at least one additional supply current independent of said supply voltage.

11. The sensor device as in claim 1, being a two-wire sensor device or a Hall sensor device.

12. A system comprising a sensor device as in claim 1 and a controller device.

13. The system as in claim 12, wherein said sensor device is arranged to send information related to a diagnostic fail to said controller device and wherein said controller device is adapted to receive said information and to take action according to said received information.

14. The system as in claim 12, wherein said controller device is arranged to send a control signal to said sensor device to adapt said first and/or said second value.

15. The system as in claim 14, wherein said controller device is arranged to send said control signal on detection of a diagnostic fail.

* * * * *